United States Patent [19]

Shinozaki et al.

[11] Patent Number: 5,601,027
[45] Date of Patent: Feb. 11, 1997

[54] POSITIONING SYSTEM WITH DAMPED MAGNETIC ATTRACTION STOPPING ASSEMBLY

[75] Inventors: Hiroyuki Shinozaki; Fumio Kondo; Satoshi Mori; Masao Matsumura; Takeshi Yoshioka, all of Kanagawa-ken, Japan

[73] Assignee: Ebara Corporation, Tokyo, Japan

[21] Appl. No.: 345,809

[22] Filed: Nov. 22, 1994

[30] Foreign Application Priority Data

Nov. 22, 1993 [JP] Japan .................................. 5-316047
Dec. 21, 1993 [JP] Japan .................................. 5-345264

[51] Int. Cl.$^6$ .............................. B60L 13/04; B61K 7/00
[52] U.S. Cl. ...................... 104/249; 104/281; 104/284; 104/286
[58] Field of Search ............................. 104/138.1, 281, 104/284, 286, 290, 292, 293, 249; 318/135, 687; 310/12

[56] References Cited

U.S. PATENT DOCUMENTS

| | | | |
|---|---|---|---|
| 4,624,617 | 11/1986 | Belna | 104/284 X |
| 4,700,119 | 10/1987 | Karita | 318/687 X |
| 4,750,721 | 6/1988 | Sasada | 318/687 X |
| 5,196,745 | 3/1993 | Trumper | 318/135 X |

FOREIGN PATENT DOCUMENTS

| | | |
|---|---|---|
| 62-201713 | 9/1987 | Japan . |
| 3-35125 | 5/1991 | Japan . |
| 5-284785 | 10/1993 | Japan . |

*Primary Examiner*—S. Joseph Morano
*Attorney, Agent, or Firm*—Wenderoth, Lind & Ponack

[57] ABSTRACT

A positioning system stops a transport car traveling along a transport path at a predetermined stop position. The system includes a pair of members coupled together by a magnetic attraction force. One of the members is disposed at the stop position, while the other of the members is disposed on the transport car, and at least one of the members is attached to the stop position or the transport car through a damper. Alternatively, the system may include two pairs of members coupled together by a magnetic attraction force, in which one of each pair of the members is disposed at the stop position, while the other of each pair of the members is disposed on the transport car, and one member of one of the pairs of members is attached to a guide mechanism which restricts a direction of movement of the one member attached to the guide mechanism caused by the action of magnetic attraction force between the members. Thereby, vibration of the transport car upon stoppage at the stop position is transmitted to the damper or guide mechanism and damped by damping action of the damper or frictional loss in the guide mechanism.

24 Claims, 14 Drawing Sheets

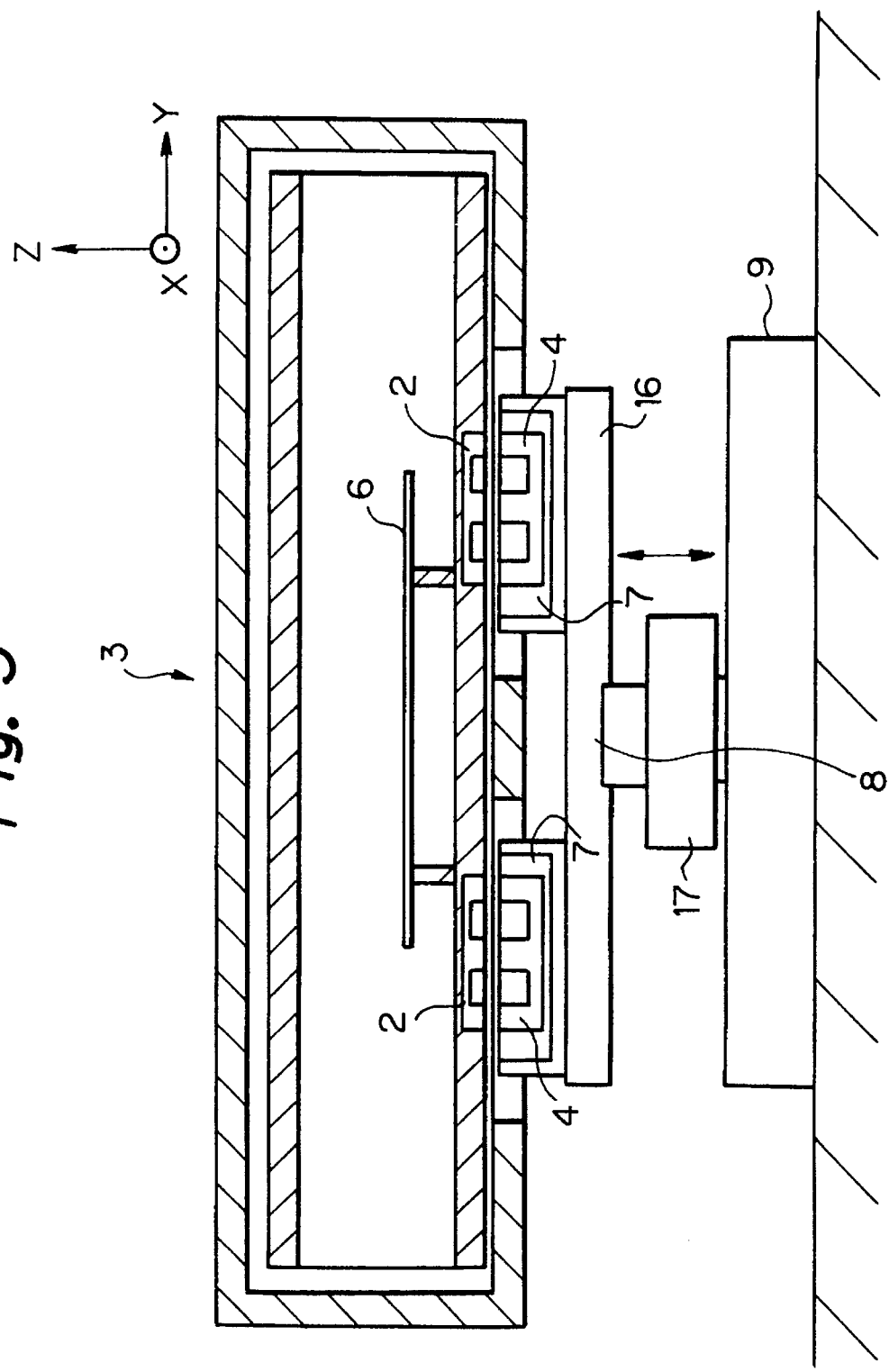

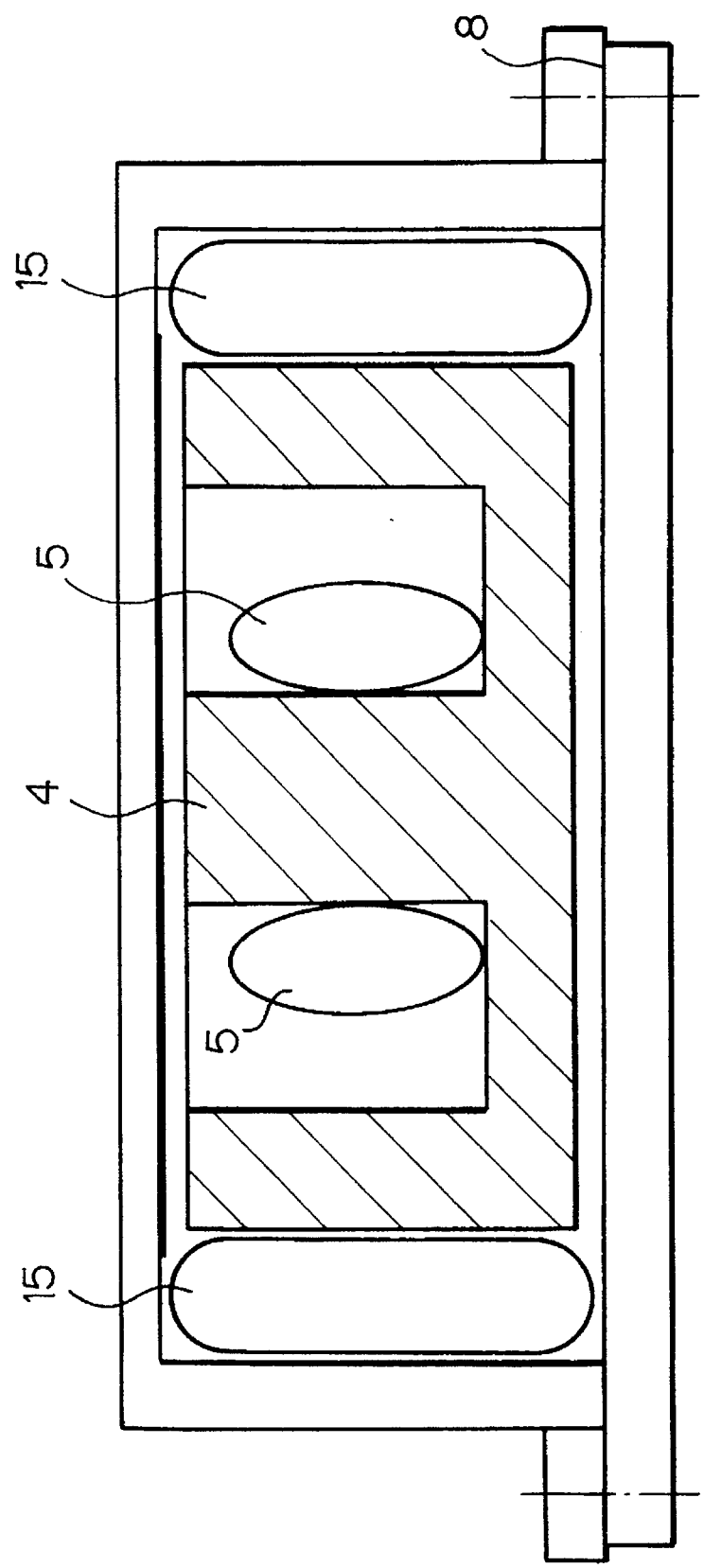

POSITIONING SYSTEM WITH DAMPED MAGNETIC ATTRACTION STOPPING ASSEMBLY

BACKGROUND OF THE INVENTION

1. Field of the Art

The present invention relates to a positioning system and, more particularly, to a positioning system wherein a transport car that levitatively travels along a transport path out of contact with the transport path is stopped at a predetermined stop position by a magnetic attraction force while levitating above the transport path.

2. Prior Art

FIG. 13 shows one example of a conventional positioning system for stopping a transport car at a predetermined stop position. A transport car 1 which travels in a direction X has magnetic members 2 provided on the bottom surface thereof, as shown in FIGS. 15(A) and 15(B), which illustrate the structure of the transport car 1 in detail. It should be noted that wheels 23 are not needed during ordinary travel in a magnetic levitation transport system wherein the transport car 1 is levitatively suspended and not in contact with a can-shaped partition 20 by levitation magnetic poles (not shown) provided outside the partition 20 and provided with propelling force by a linear motor (not shown) which is also provided outside the partition 20 so that the transport car 1 levitatively travels inside the can-shaped partition 20.

Transport car 1 has secured to the bottom surface thereof magnetic member 2 in the form of an iron core and being a secondary-side magnetic member. On the other hand, a primary-side electromagnet 4 is disposed at a stop position on a transport path 3 in such a manner that pole-face 4a of the electromagnet 4 faces the secondary-side magnetic member 2. By energizing a coil 5 wound on the primary-side electromagnet 4 when the transport car 1 reaches stop position, the pole-face 2a of the secondary-side iron core 2 is attracted to the pole-face 4a of the electromagnet 4, thereby enabling the transport car 1 to be stopped at a predetermined position in a non-contact manner.

FIG. 14 illustrates the relationship between the displacement X of the transport car 1 from the stop position (equilibrium position) and restoring force f during the above-described stopping operation. As will be understood from the FIG. 14, when the displacement X is positive, a negative restoring force f acts, whereas, when the displacement X is negative, a positive restoring force f acts. Accordingly, the transport car 1 having inertial force vibrates about the point of displacement x=0 (equilibrium point), and such vibration is damped by the action of air resistance, resistance by eddy current loss, and so forth. Eventually, the transport car 1 stops at the equilibrium point.

Since this type of non-contact positioning system stops the transport car by applying a braking force thereto in a non-contact manner, it has advantages in that there is no wear of a contact surface, no dust is generated, and hence maintenance is facilitated in comparison to other positioning systems that utilize a mechanical frictional force. Accordingly, if such a non-contact type positioning system can be incorporated into a magnetic levitation transport system or the like, in which a transport car is levitatively suspended and driven horizontally by a linear motor, it is possible to realize a transport system in which levitative support, driving and braking of the transport car can be all effected in a non-contact manner. Thus, such a transport system is extremely suitable for use in a clean area in which generation of dust must be avoided.

However, when the above-described non-contact type positioning system is incorporated into a magnetic levitation transport system or the like, the following problems arise: If a transport car, which is levitatively supported in the vertical direction by a magnetic attraction force and driven horizontally by a linear motor for traveling and which thus has inertial force, is stopped by the positioning system in which a restoring force acts, as shown in FIG. 14, the transport car vibrates in the travel direction or other direction about the equilibrium point (x=0), as described above. In this case, since the transport car is in a non-contact state, no frictional resistance occurs, but only a damping force acts thereon by the action of air resistance, eddy current loss, and so forth. For this reason, the vibration cannot readily be damped, and it takes a great deal of time to stop the transport car.

In view of the above-described problems of the prior art, an object of the present invention is to provide a positioning system which may be incorporated into a magnetic levitation or other non-contact type transport system and which is capable of stopping a transport car in a short period of time.

SUMMARY OF THE INVENTION

In order to accomplish the object stated above, according to one aspect of the present invention, a positioning system for stopping a transport car traveling along a transport path at a predetermined stop position includes a pair of members coupled together by a magnetic attraction force, wherein one of the members is disposed at the stop position, while the other is disposed on the transport car, and at least one of the members is attached to the stop position or transport car through a damper.

In this aspect of the invention, if the stop position-side member has freedom of movement in the horizontal plane, the vibration of the transport car in the horizontal plane is transmitted to the stop position-side member when the transport car is stopped in a non-contact manner by magnetic attraction force from an electromagnet provided at a stop position. When the stop position-side member is provided with a damping force by the damper, the damping force acts indirectly on the transport car coupled thereto by magnetic attraction force. Thus, the vibration of the transport car can be damped immediately.

If the transport car side member has freedom of movement in the horizontal plane, a damping force directly acts to the transport car when the transport car is stopped by the magnetic attraction force at a stop position and the vibration of the transport car is damped immediately. Accordingly, the transport car promptly stops at a predetermined stop position.

According to an another aspect of the invention, a positioning system for stopping a transport car traveling along a transport path at a predetermined stop position, includes two pairs of members coupled together by a magnetic attraction force, in which one of each pair of members is disposed at the stop position, while the other of each pair of members is disposed on the transport car, member of one of the pairs of members is movably attached to the stop position through a guide mechanism which restricts the direction of movement of the one member attached to the stop position by the action of magnetic attraction force acting between the members.

In this second aspect of the invention, one pair of members are coupled together by a magnetic attraction force, wherein one member is disposed at the stop position, while the other is disposed on the transport car and the vibration of the transport car in the vicinity of the stop position is transmitted to the stop position-side member through the magnetic attraction force acting between one pair of members. Since the one of the stop position-side members is movably attached to the stop position through a guide mechanism, a frictional force in the guide mechanism acts on this stop position-side member so as to damp the vibration thereof. As the vibration of the stop position-side member is damped, the damping force is transmitted to the transport car, which is coupled to the stop position-side member by magnetic attraction force thereby allowing the vibration of the transport car to be damped promptly. Since the transport car is coupled to the stop position side by another pair of members coupled together by magnetic attraction force, the transport car is stably and quickly stopped at the predetermined stop position.

In this invention, the vibration of the transport car upon stoppage at the stop position is transmitted to a member attached to the damper or the guide mechanism and the vibration is suppressed by damping action of the damper or frictional loss in the guide mechanism other than magnetic coupling between the member disposed on the transport car and the member disposed at the stop position. Thus, the vibration of the transport car is rapidly suppressed and the transport car is stopped in a short time.

The above and other objects, features and advantages of the present invention will become more apparent from the following description when taken in conjunction with the accompanying drawings in which preferred embodiments of the present invention are shown by way of illustrative examples.

BRIEF DESCRIPTION OF THE DRAWINGS

FIG. 3 is a sectional view taken along a plane perpendicular to the transport direction, showing a positioning system according to a second embodiment that uses an actuator capable of vertically moving a moving table;

FIG. 5 is a sectional side view showing the structure of a passive damper according to another embodiment;

PREFERRED EMBODIMENTS OF THE INVENTION

Embodiments of the present invention will be described below with reference to the accompanying drawings.

Figure 1:
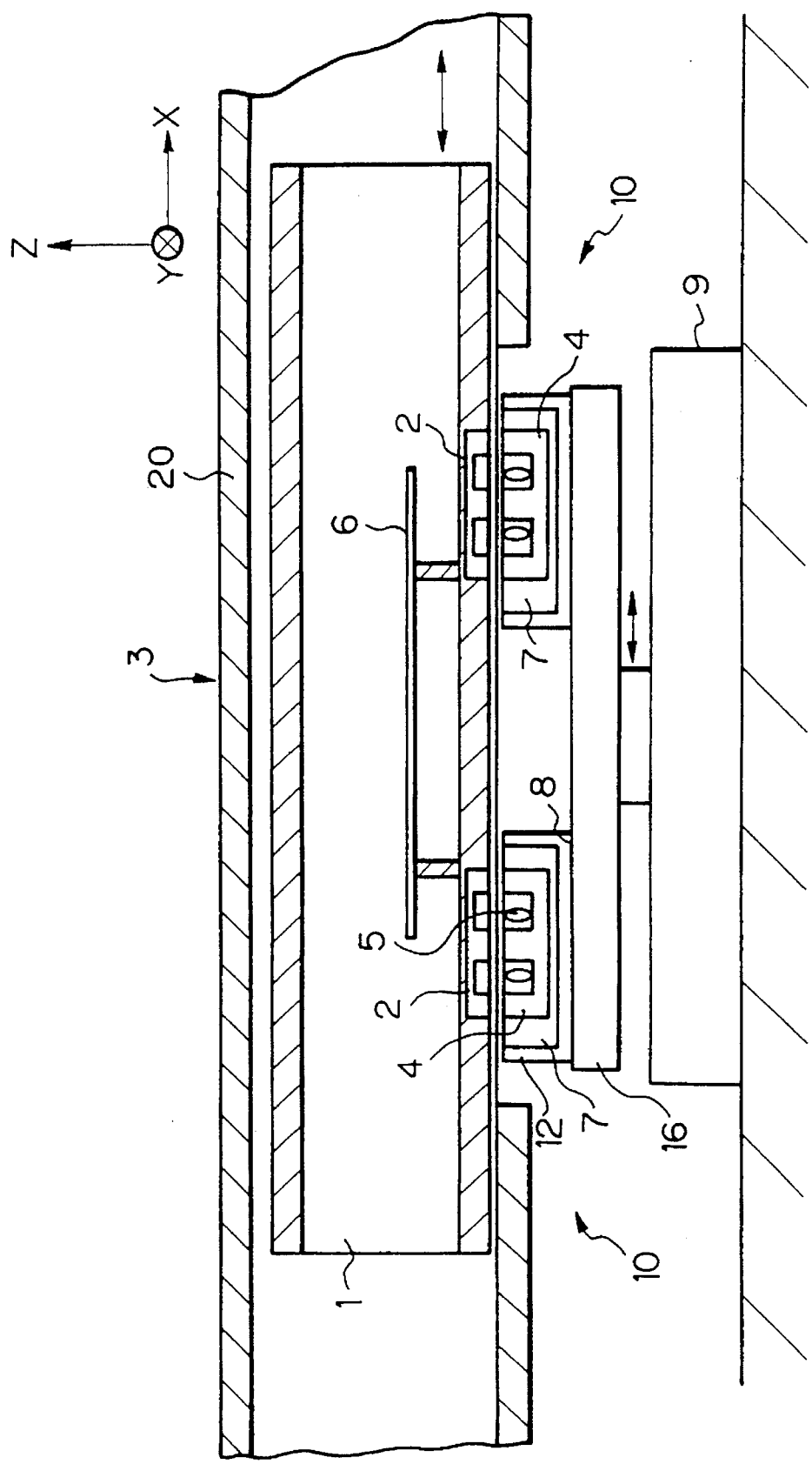
FIG. 1 is a sectional view of a positioning system according to a first embodiment of the present invention, taken along a transport direction.
Figure 2:
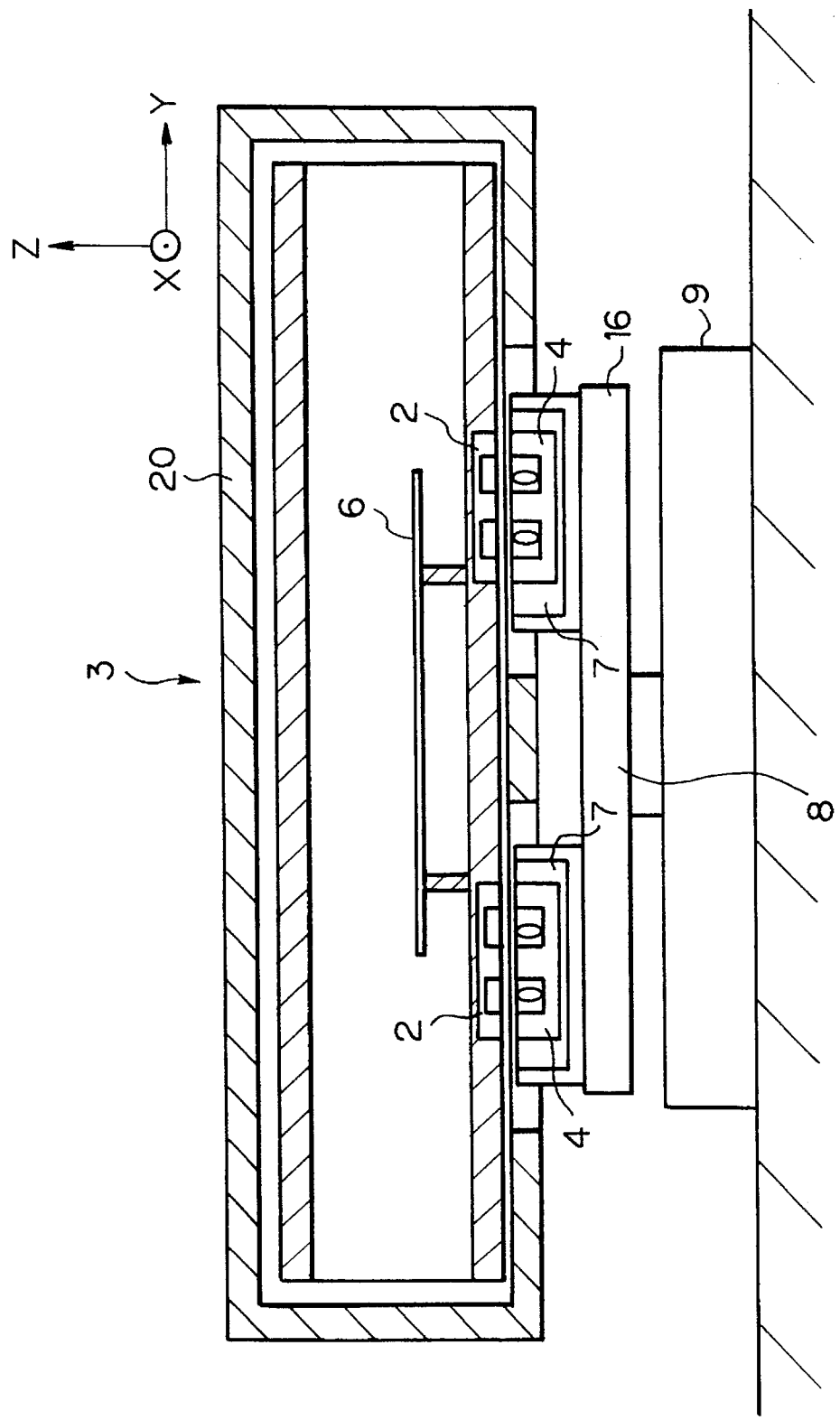
FIG. 2 is a sectional view of the positioning system according to the first embodiment of the present invention, taken along a plane perpendicular to the transport direction.
Figure 15A:
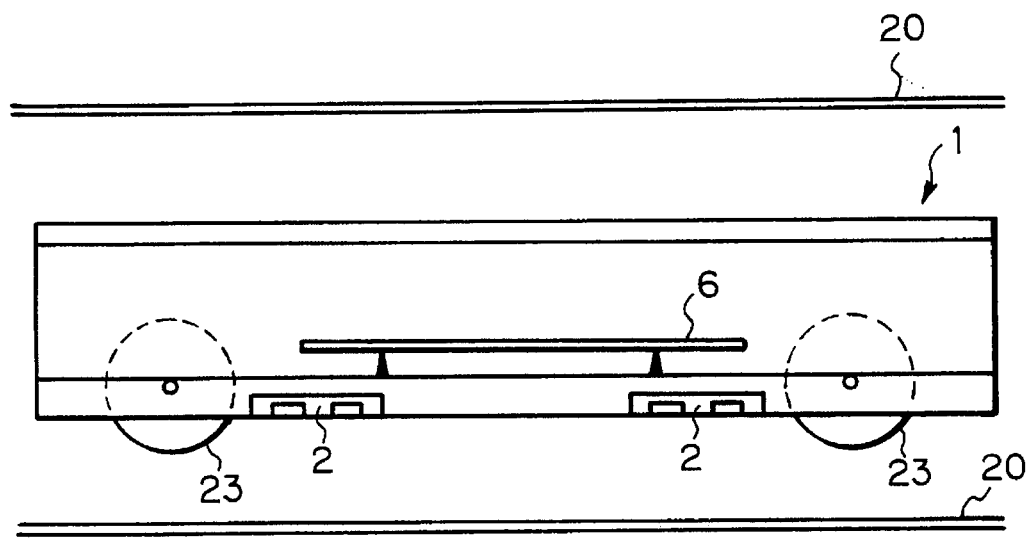
FIGS. 15(A) and 15(B) are side and plan views, respectively, of a transport car having secondary-side magnetic members in the conventional positioning system.
Figure 15B:
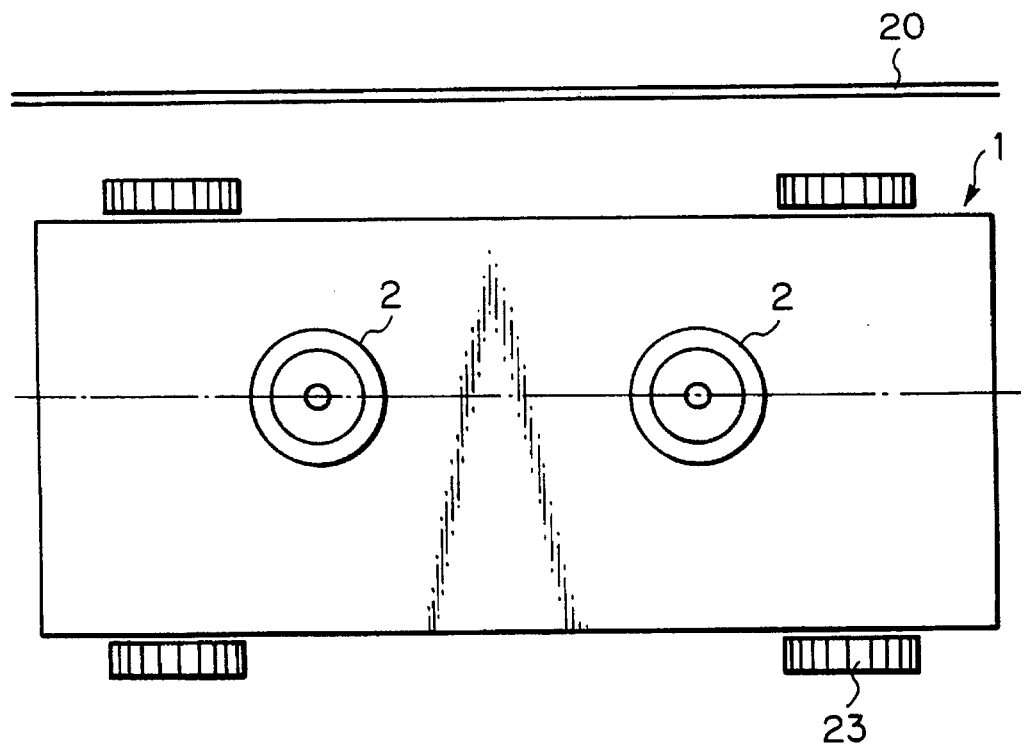

FIG. 1 is a sectional view taken along a transport direction, showing a positioning system according to a first embodiment of the present invention. FIG. 2 is a sectional view taken along a plane perpendicular to the transport direction. A transport car 1 is levitatively suspended by electromagnets (not shown) and provided with a propelling force by a linear motor (not shown) so as to travel levitatively in the X-direction inside a can-shaped tunnel partition 20, with a wafer 6 mounted thereon. Such a magnetic levitation transport system is disclosed in detail, for example, in International Patent Application No. PCT/JP93/00930. The transport car 1 has magnetic members 2 provided on the bottom surface thereof as secondary-side magnetic poles similar to those shown in FIG. 15. The transport car 1 has no sensor target for positioning on the bottom surface thereof.

Meanwhile, at a predetermined stop position, electromagnets 4 serving as primary-side magnetic poles are disposed at a position which face the magnetic members 2 as the secondary-side magnetic poles of the transport car 1 when stopped at the stop position. Each electromagnet 4 is attached to a securing surface 8 through a passive damper 7. The electromagnet 4 has freedom of movement in the horizontal plane (both X- and Y-directions) along the securing surface 8. The damper 7 causes restoring force and damping force to act against the movement of the electromagnet 4. In addition, the electromagnet 4 is structured so that it is restrained from moving in a direction normal to the securing surface 8 (i.e. the Z-direction). The securing surface 8 is provided on a moving table 16, which is mounted on a linear guide 9 composed of a ball screw and a linear bearing. By actuating the ball screw, the moving table 16 having the electromagnets 4 mounted thereon can be moved to a desired position in either the X- or Y-directions.

Figure 4A:
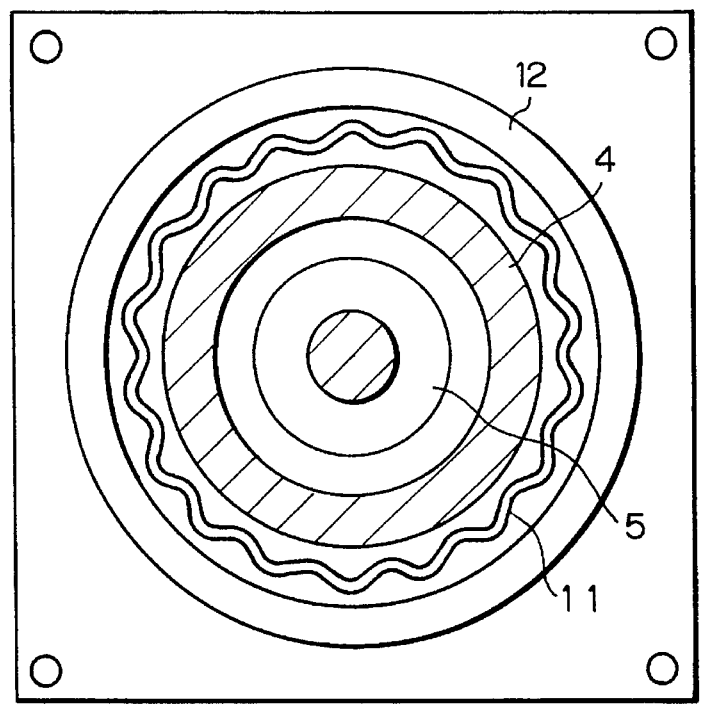
FIGS. 4(A) and 4(B) are plan and sectional side views, respectively, showing the structure of a passive damper in detail.
Figure 4B:
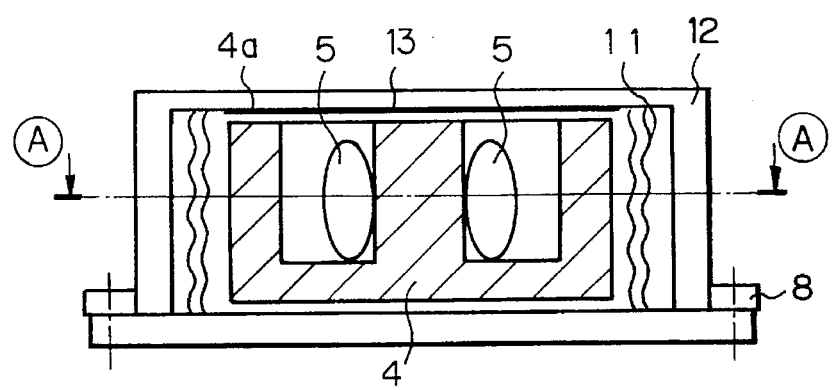
Figure 4C:
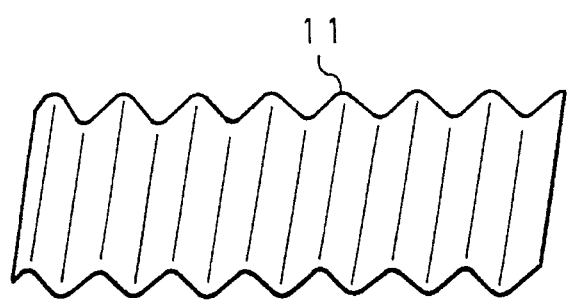
FIG. 4(C) is a perspective view showing the configuration of a plate spring.

FIGS. 4(A) through 4(C) show one example of the structure of the damper 7 in detail. FIG. 4(A) is a plan view of the damper 7, FIG. 4(B) is a sectional side view of the damper 7, and FIG. 4(C) is a perspective view of a plate spring 11 disposed in the damper 7. Around the magnetic pole of the electromagnet 4 having a coil 5 is disposed plate spring 11 which is a corrugated thin plate of phosphor bronze as shown, for example, in FIG. 4(C). The electromagnet 4 and the plate spring 11 are hermetically sealed in a metallic thin cylindrical container 12 together with a viscous fluid, e.g., oil. A Teflon sheet 13 is stuck on the upper end surface of the cylindrical container 12 that faces the top surface of the electromagnet 4.

Accordingly, the electromagnet 4 has freedom of movement in the X- or Y-directions, and when it is displaced from the center position thereof, a restoring force from the plate spring 11 acts on the electromagnet 4. In addition, when the electromagnet 4 moves, a damping force acts thereon by virtue of the viscosity of the oil. Movement of the electromagnet 4 in the Z-direction is limited by the upper end surface and bottom surface of the cylindrical container 12, and thus electromagnetic 4 is restrained from moving in the Z-direction. Regarding the Teflon sheet 13, when the transport car 1 is being positioned at the stop position, magnetic attraction force in the Z-direction acts on the pole-face 4a of the electromagnet 4 with respect to the corresponding magnetic member 2, which is provided on the transport car 1, causing the electromagnet 4 to be attracted upwardly. Moreover, the electromagnet 4 vibrates along the Teflon sheet 13 in the X-or Y-direction, following the vibration of the transport car 1. Accordingly, the Teflon sheet 13 is provided to assist the pole-face 4a of the electromagnet 4 in smoothly vibrating in the horizontal plane.

The positioning system in this embodiment operates as follows: The transport car 1 travels in the X-direction inside the tunnel partition 20. When the transport car 1 reaches a predetermined stop position, an electric current is supplied to the coils 5 of the electromagnets 4, causing magnetic attraction force to act on the magnetic members 2 provided on the bottom surface of the transport car 1. In the vicinity of the stop position, the magnetic members 2 of the transport car 1 and the electromagnets 4 are coupled together at their pole-faces by magnetic attraction force. Accordingly, when rectilinear vibration in the X- or Y-directions or rotational vibration about the Z-axis occurs on the transport car 1 in the vicinity of the stop position, such vibration is also transmitted to the electromagnets 4, which are provided at the stop position. Consequently, a damping force and restoring force act against the vibration of the electromagnets 4 by virtue of the function of the plate springs 11 and the viscosity of a viscous fluid, e.g., oil. Accordingly, the vibration of the electromagnets 4 is damped rapidly, and the damping force is transmitted to the transport car 1 having the magnetic members 2 coupled to the electromagnets 4 by a magnetic attraction force. Thus, the vibration of the transport car 1 is also damped rapidly.

Since in this embodiment a plurality of sets of positioning systems 10 are provided for a single transport car, as shown in FIGS. 1 and 2, particularly rotational vibration about the Z-axis can be damped promptly. It should be noted that the passive damper 7 may be replaced by a viscous rubber 15. That is, as shown in FIG. 5, the electromagnet 4 having the coil 5 may be accommodated in the cylindrical container 12 in such a manner that the electromagnet 4 is wrapped with the viscous rubber 15. The viscous rubber 15 can cause a restoring force and damping force to act against the vibration of the electromagnet 4 in the same way as in the case of the combination of a plate spring and oil.

Further, the securing surface 8 to which the electromagnet 4 is attached through the damper 7 is secured to the moving table 16. The moving table 16 is supported by the linear guide 9, which is supported by a ball screw and a linear bearing. Therefore, by rotating the ball screw, the moving table 16 can be moved to a desired position in the X- and Y-directions. Accordingly, in such a case that at a predetermined stop position of the transport car 1, the position of the wafer 6 mounted on the transport car 1 is displaced from the handing position of a robot for transferring the wafer 6, the position of the positioning electromagnets 4 is shifted by moving the moving table 16 in either the X- or Y-direction, thereby moving the transport car 1 coupled to the electromagnets 4 by magnetic attraction force. In this way, the position of the wafer 6 mounted on the transport car 1 can be shifted to a position where the robot can perform handling.

Although in the foregoing embodiment electromagnets are used at the stop position, it should be noted that the electromagnets may be replaced by permanent magnets. However, in the case of permanent magnets, magnetic flux is produced therefrom at all times, unlike electromagnets, which produce magnetic flux only when an electric current is supplied to their coils. Accordingly, when the transport car 1 is to pass over the positioning systems 10, it is necessary to separate the permanent magnets from the traveling surfaces of the magnetic members 2 of the transport car 1 in the Z-direction so that the permanent magnets and the magnetic members 2 will not couple together by magnetic attraction force. For this reason, it is preferable to provide an actuator 17 which is capable of vertically moving the moving table 16, as shown in FIG. 3.

Figure 6:
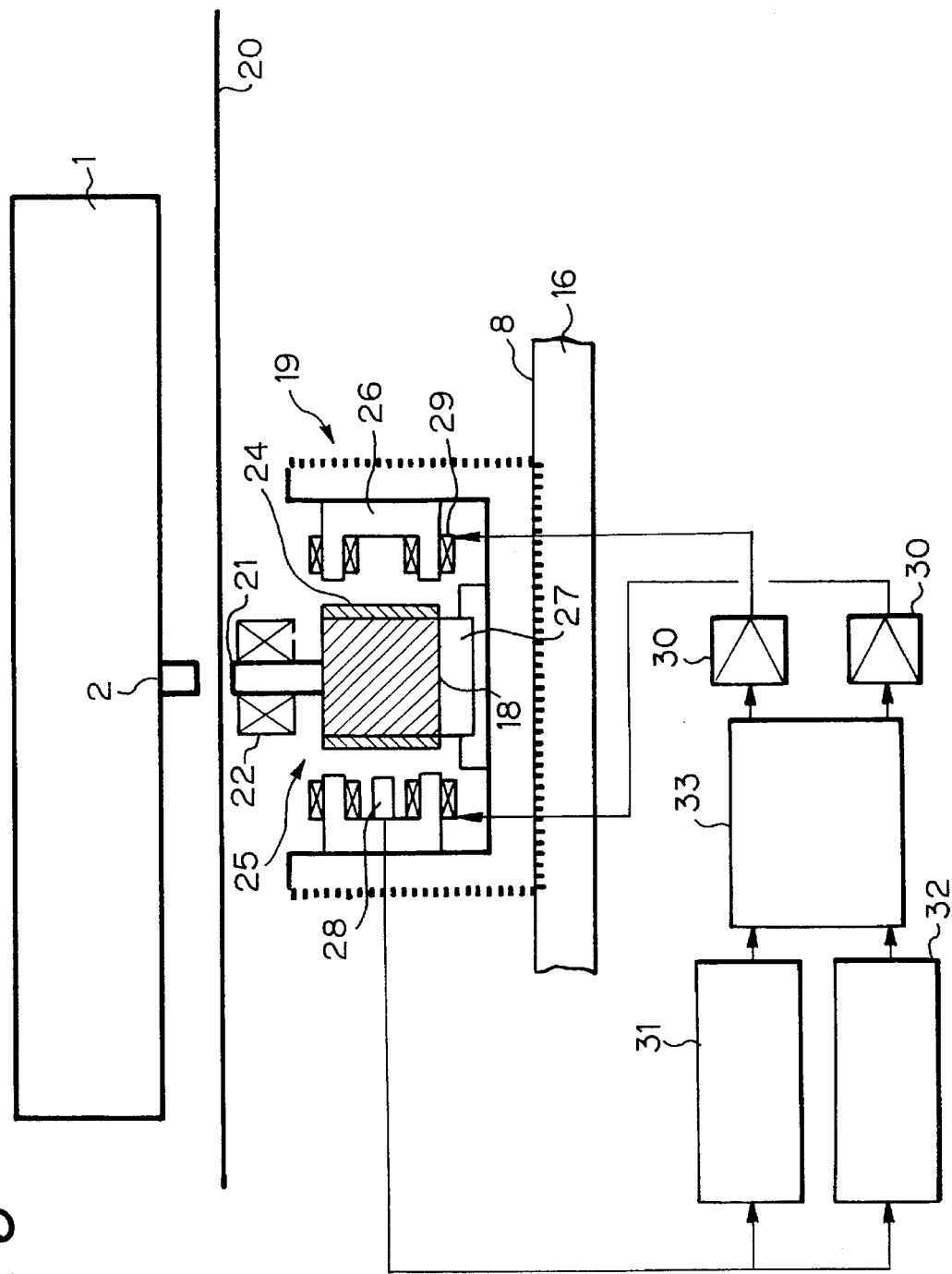
FIG. 6 is a schematic view illustrating a positioning system according to a third embodiment of the present invention.

FIG. 6 shows the arrangement of a positioning system according to a third embodiment of the present invention. The arrangement is intended to damp vibration of a transport car that occurs in the vicinity of a stop position when the transport car is stopped at the stop position, by using an active damper.

An electromagnet 21 as a primary-side member is provided at a stop position of a transport system outside a partition 20, while a magnetic member 2 as a secondary-side member is attached to a transport car 1, in the same way as in the first embodiment. Further, the transport car 1 is levitatively supported in a non-contact manner by levitation electromagnets (not shown) in a space of high cleanliness, e.g., a vacuum, through the partition and provided with a propelling force by a linear motor so that the transport car 1 travels levitatively. The electromagnet 21 is fixed to a vibrator 18 of substantial mass. The vibrator 18 is attached to a securing surface 8 provided on a moving table 16, which is provided at the stop position, through an active damper 19. The third embodiment is the same as the first embodiment in that the stop position-side electromagnet 21 is installed on the moving table 16 so that it is movable.

Figure 7:
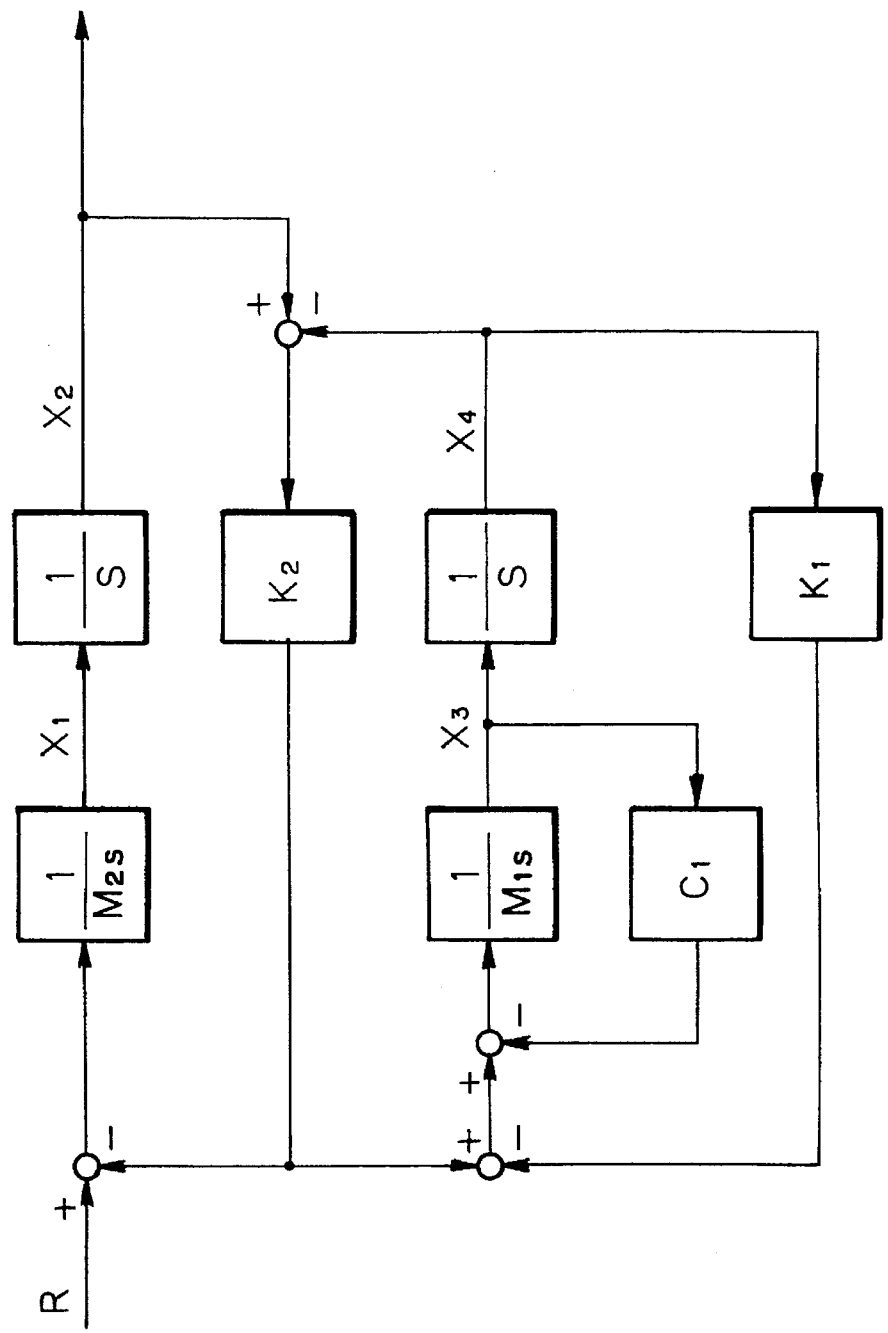
FIG. 7 is a block diagram of a control system in the third embodiment.

The vibrator 18 has a magnetic member 24 on the outer peripheral surface thereof so as to be a target of an electromagnet 26 constituting a radial magnetic bearing 25. Further, the vibrator 18 is supported at the bottom surface thereof by a guide 27 so as to be movable in the horizontal plane (both X- and Y-directions). However, the vibrator 18 is restrained from moving in the vertical direction (Z-direction). In addition, the third embodiment includes a sensor 28 for detecting information (speed and displacement) about motion of the vibrator 18 in the horizontal plane, so that a control current is supplied to a coil 29 of the radial magnetic bearing 25 from a current amplifier 30 through speed and displacement detections 31, 32 and a control circuit 33. The control circuit 33 is a signal processing unit for stably stopping the transport car 1 by suppressing vibration thereof. FIG. 7 is a block diagram of the structure of the control system shown in FIG. 6. The relationship between the amount of displacement of the transport car and the controlling force applied to the transport car may be expressed in the form of a transfer function as shown by the following equation (1). The relationship between disturbance to the transport car and the amount of displacement of the transport car may be expressed in the form of a transfer function as shown by the following equation (2). In FIG. 7 and the equations (1) and (2), $M_1$: Vibrator mass
$M_2$: Transport car mass
$K_1$: Restoring stiffness acting on vibrator
$K_2$: Restoring stiffness acting on primary and secondary sides
$C_1$: Damping stiffness acting on vibrator
$X_1$: Velocity of transport car
$X_2$: Displacement of transport car
R: Disturbance Math. 1
Transfer function of compensating system:

$$\frac{\text{controlling force}}{\text{displacement of transport cart}}$$

$$\frac{F(s)}{X_2(s)} = \frac{K_2(M_1 s^2 + C_1 s + K_1)}{M_1 s^2 + C_1 s + K_1 + K_2} \quad (1)$$

Math. 2
Transfer function of control system:

$$\frac{\text{disturbance}}{\text{displacement of transport cart}}$$

$$\frac{R(s)}{X_2(s)} = \quad (2)$$

$$\frac{M_1 s^2 + C_1 s + K_1 + K_2}{M_1 M_2 s^4 + M_2 C_1 s^3 + (M_2(K_1 + K_2) + K_1 K_2)s^2 + K_2 C_1 s + K_2 K_1}$$

Figure 8:
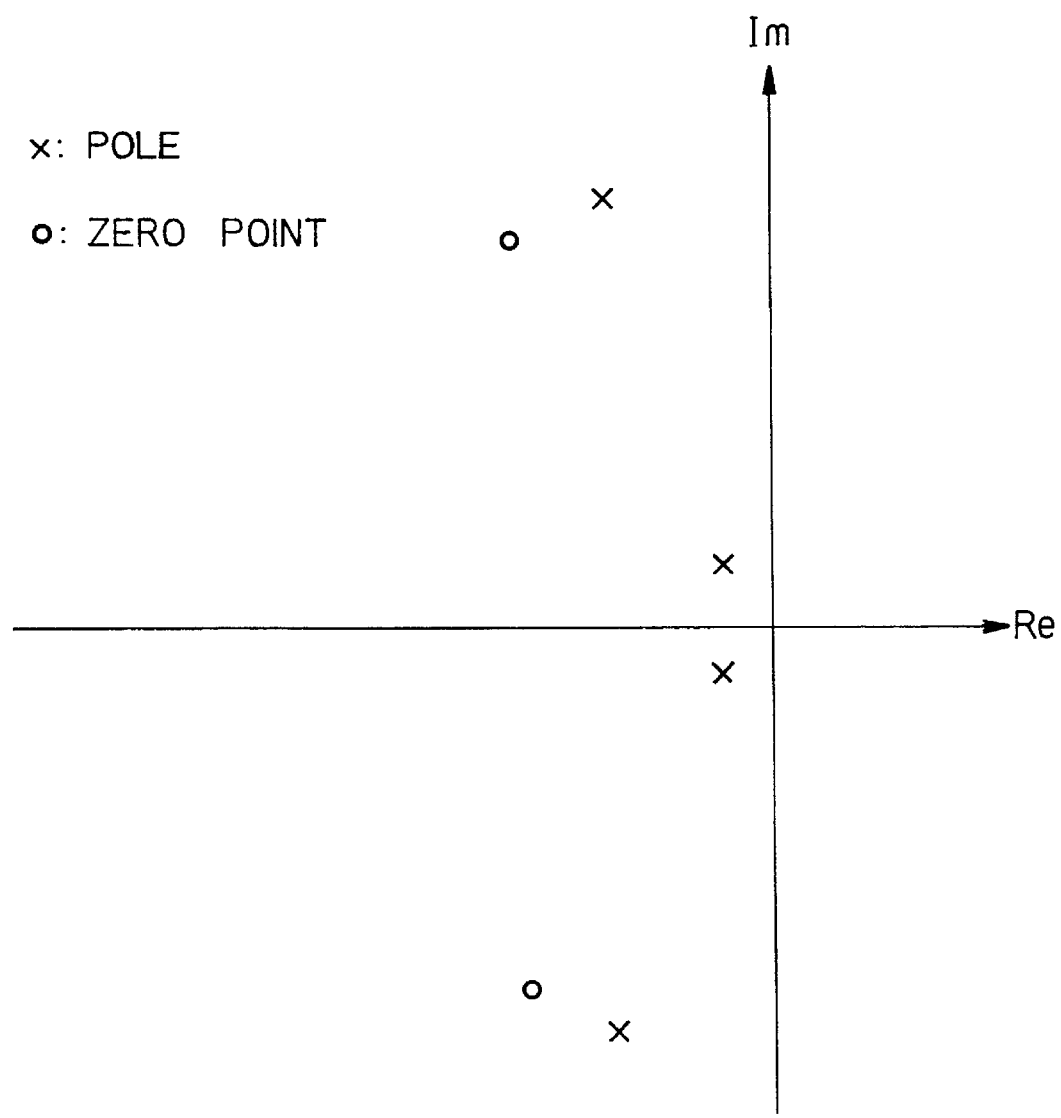
FIG. 8 is a graph illustrating a root configuration of the control system in the third embodiment.

FIG. 8 shows a pole-zero configuration given when a root configuration of the control system is obtained, for example, under the following conditions:

Vibrator mass : $M_1=1$ (kg)

Transport car mass: $M_2=5$ (kg)

Control stiffness acting
  on vibrator; Restoring stiffness: $K_1=100$ (N/m)
  Damping stiffness : $C_1=20$ (Ns/m)

Restoring stiffness acting on primary and secondary sides: $K_2=1,000$ (N/m)

As will be clear from FIG. 8, all poles and zero points lie on the left-half plane.

Figure 9:
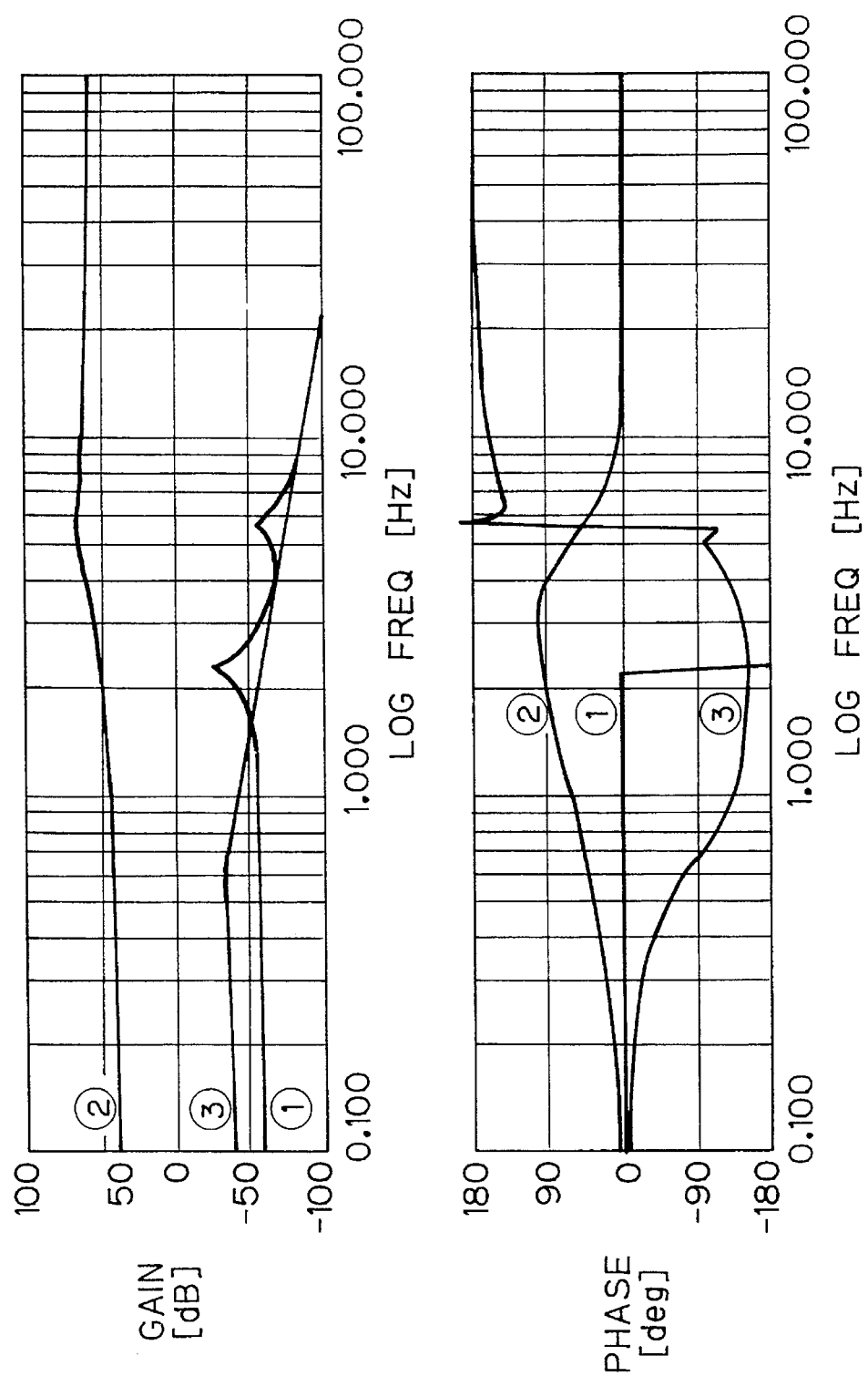
FIG. 9 is a graph illustrating frequency characteristics of the control system in the third embodiment.

FIG. 9 shows: ① frequency characteristics of a system consisting of the mass $M_2$ of the transport car as a controlled object and the restoring stiffness $K_2$; ② frequency characteristics of a compensating system in which the input is the amount of displacement of the transport car, and the output is force applied to the transport car; and ③ frequency characteristics of the closed loop of the entire control system. The frequency characteristics ① are characteristics having a resonance frequency, while the frequency characteristics ② are characteristics in which the phase characteristics in a band near the resonance frequency are advanced. As a result, in ③, the peaks of gain in ① have disappeared.

Figure 10:
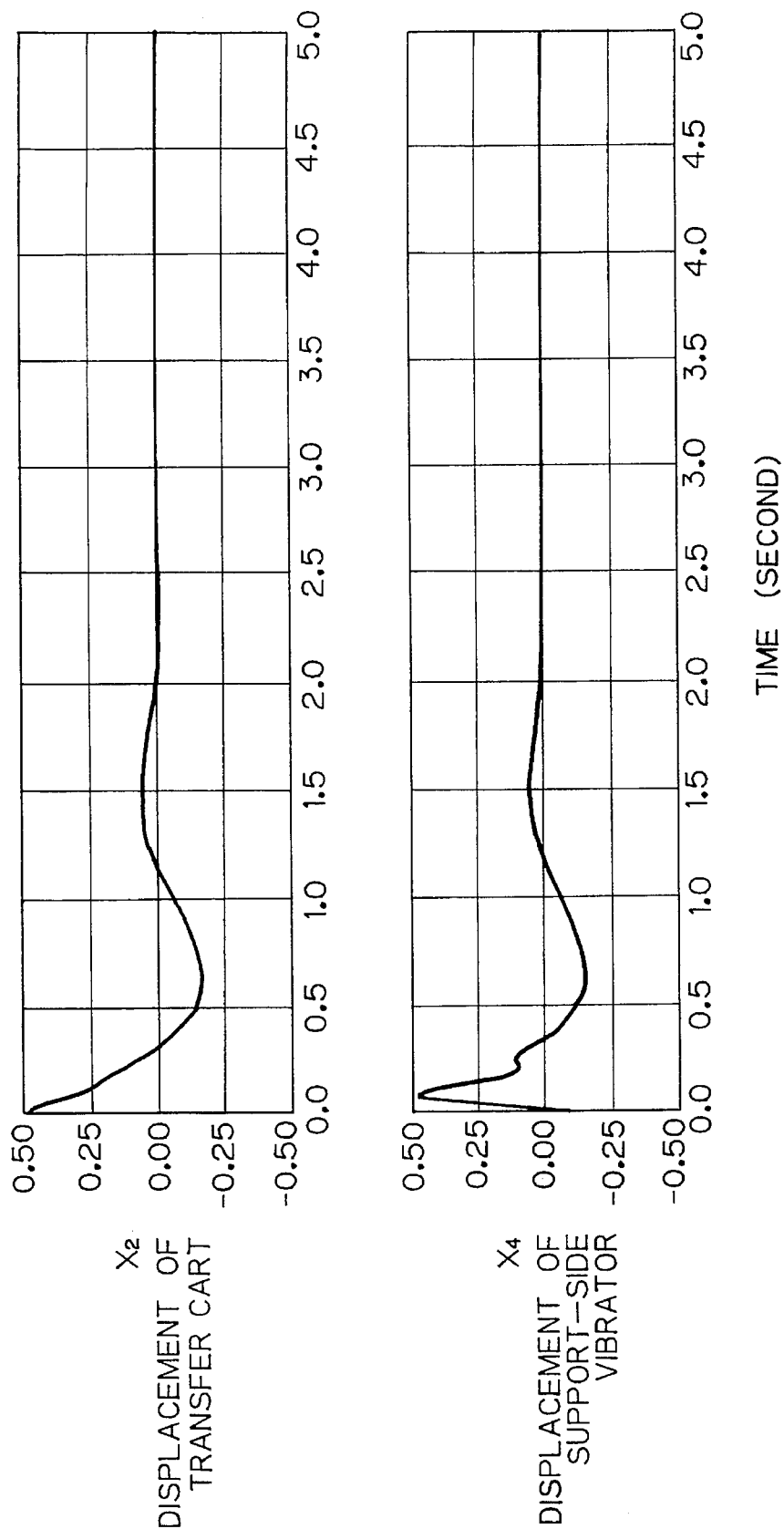
FIG. 10 is a graph illustrating a time response in positioning of a transport car in the third embodiment.

Next, a time response is obtained. FIG. 10 shows results of time response obtained by calculating amounts of displacement of the transport car and the vibrator when an initial amount of displacement is given to the transport car. In about 3 seconds, the vibration of the transport car is damped, and the transport car is stably positioned.

It should be noted that in the foregoing embodiments a transport car is levitatively suspended in a vacuum tunnel partition by magnetic attraction force from levitation electromagnets, which are provided outside the partition, and subjected to a propelling force from a linear motor, which is also provided outside the partition, so that the transport car levitatively travels inside the partition. However, the atmosphere in the tunnel partition may also be any of various gas atmospheres or clean air. It is also possible to apply the present invention to an ordinary transport car using wheels in addition to a magnetic levitation transport system having a can-shaped partition, as a matter of course.

Further, the pair of members which are coupled together by magnetic attraction force may be a pair of members one of which is a magnetic member disposed at the stop position, and the other of which is an electromagnet or a permanent magnet disposed on the transport car. The passive damper may be attached to the transport car. The magnetic members may be replaced by permanent magnets. Thus, various modifications may be imparted to the described embodiments.

According to the positioning system of the embodiments described above, it is unnecessary to detect an amount of displacement of the transport car, and the transport car needs no sensor target for positioning. In addition, the material comprising the partition may be a good electrical conductor, provided that it is a non-magnetic material. Accordingly, it becomes easy to produce a partition for realizing a space of high cleanliness, e.g., a vacuum, and it is possible to realize a positioning system which is simple in structure and excellent in controllability and which is applicable to a magnetic levitation transport system in which levitative travel of a transport car is controlled from outside a partition.

Figure 11:
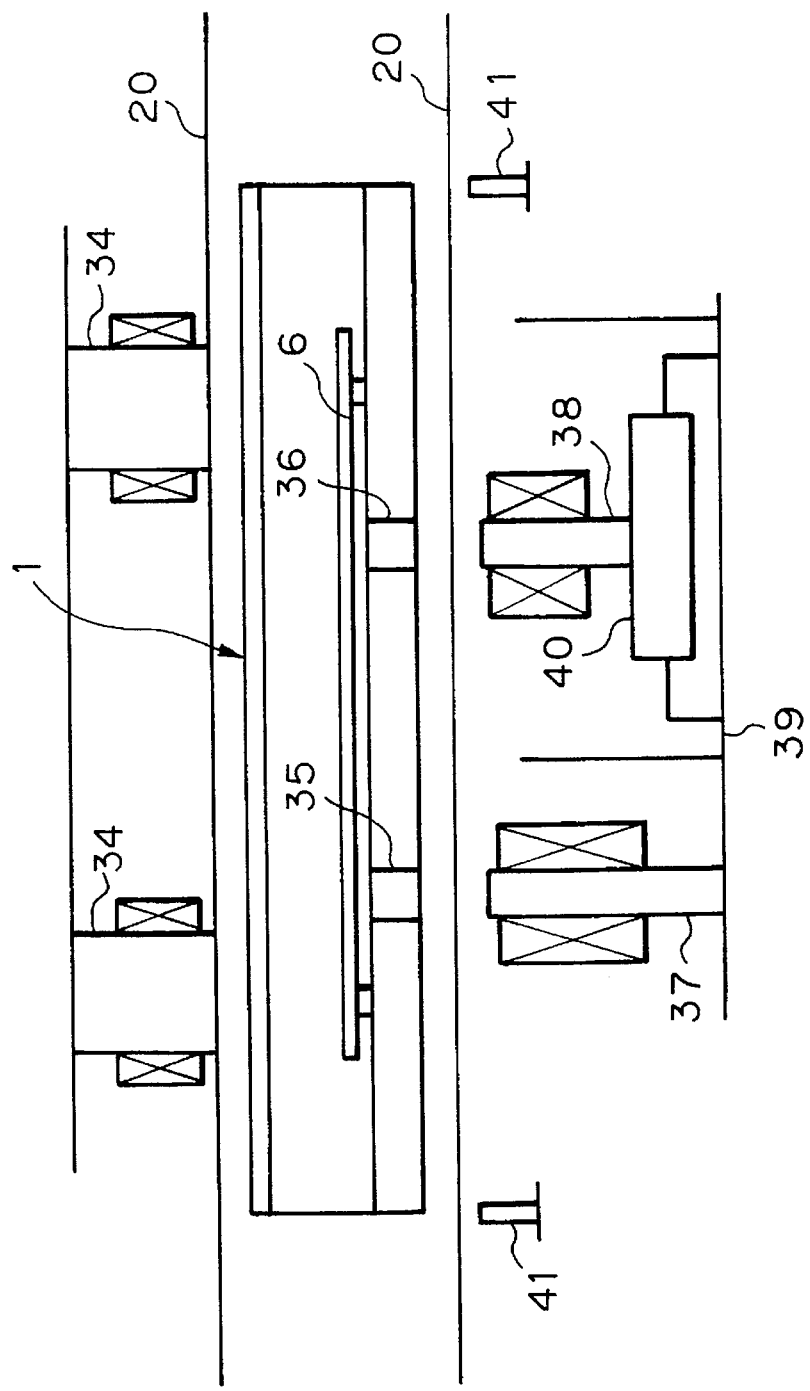
FIG. 11 is a schematic view illustrating a positioning system according to a fourth embodiment of the present invention.

FIG. 11 is a sectional view taken along a transport direction, showing a positioning system according to a fourth embodiment of the present invention. A transport car 1 is levitatively suspended by levitation electromagnets 34 and is provided with a propelling force by a linear motor (not shown) so that the transport car 1 levitatively travels inside a can-shaped tunnel partition 20, with an object of transport 6, e.g., a wafer, mounted thereon. The inside of the can-shaped tunnel partition 20 exists in a vacuum atmosphere. The transport car 1 has two magnetic members 35 and 36 provided on the bottom surface thereof as secondary-side magnetic poles. The transport car 1 has no sensor target for positioning on the bottom surface thereof as is used in the conventional positioning systems.

Meanwhile, at a predetermined stop position of the transport car 1, two electromagnets 37 and 38 as primary-side magnetic poles are disposed at positions which face the secondary-side magnetic poles 35 and 36 of the transport car 1 when stopped at the stop position. One electromagnet 37 forms a holding magnetic pole, which is secured directly to a transport system securing surface 39. The other electromagnet 38 is attached to a guide mechanism 40 that restricts the direction of the movement of the electromagnet 38 by the action of magnetic attraction force, which acts between the magnetic pole of the electromagnet 38 and the magnetic member 36 provided on the transport car 1. The guide mechanism 40 is secured to the transport system securing surface 39. A sensor 41 detects the transport car 1 approaching the vicinity of the stop position. A signal from the sensor 41 is transmitted to a control circuit (not shown). When an operation of stopping the transport car is to be performed, the electromagnets 37 and 38 are excited to cause magnetic attraction force to act between the electromagnet 37 and the magnetic member 35 and also between the electromagnet 38 and the magnetic member 36, thereby coupling together these members by magnetic attraction force, and thus stopping the transport car 1.

Next, the operation of the positioning system of this embodiment will be explained. First, when the transport car 1 traveling inside the can-shaped tunnel partition 20 approaches a predetermined stop position, the sensor 41 detects the approach of the transport car 1. Then, the coil of the electromagnet 37, which serves as a holding magnetic pole, and the coil of the electromagnet 38, which serves as a damping magnetic pole, are energized to excite their magnetic poles. When the transport car 1, which is levitatively suspended by the levitation electromagnets 34, reaches the vicinity of the stop position, magnetic circuits are formed between on the one hand the magnetic members 35 and 36, which are provided on the transport car 1, and on the other the respective magnetic poles of the electromagnets 37 and 38, which are paired with the magnetic members 35 and 36, so that magnetic flux passes through each pair of members. Thus, each pair of members, i.e., the electromagnet 37 and the magnetic member 35, and the electromagnet 38 and the magnetic member 36, are coupled together by magnetic attraction force. The transport car 1 is levitatively suspended in the vertical direction by the levitation electromagnets 34 and restrained from moving in the vertical direction. Accordingly, the magnetic attraction force acting between the two pairs of members, i.e., the electromagnet 37 and the magnetic member 35, and the electromagnet 38 and the magnetic member 36, causes the transport car 1 to vibrate in the horizontal direction about the stop position (equilibrium point) of the transport car 1, as has been described above.

However, since the electromagnet 38, which serves as a damping magnetic pole, is attached to the securing surface 39 through the guide mechanism 40, the electromagnet 38 is restrained from moving in the direction (vertical direction) in which magnetic attraction force acts between the magnetic member 36 and the electromagnet 38 acts but is allowed to move freely in any direction in the horizontal plane. Although the guide mechanism 40 allows vibration of the electromagnet 38 in any direction in the horizontal plane, such vibration causes frictional force because the guide mechanism 40 is a mechanical device.

In the meantime, the transport car 1 vibrates in the vicinity of the stop position at the pair of members, i.e., the electromagnet 37 as a holding magnetic pole and the magnetic member 35, which are coupled together by magnetic attraction force. The vibration of the transport car 1 is transmitted to the electromagnet 38 through the pair of members, i.e., the electromagnet 38 as a damping magnetic pole and the magnetic member 36, which are coupled together by magnetic attraction force. The electromagnet 38, which serves as a damping magnetic pole, vibrates in the horizontal plane along the guide mechanism 40, but the vibration of the electromagnet 38 is quickly damped by the above-described frictional force. As the vibration of the electromagnet 38 is damped, the vibration of the transport car 1, to which is secured the magnetic member 36 paired with the electromagnet 38 by a magnetic attraction force, is also quickly damped. Accordingly, the transport car 1 is stopped at an equilibrium position where the pole-face of the electromagnet 37, which is secured to the securing surface 39 to serve as a holding magnetic pole, and the pole-face of the magnetic member 35 face each other. In this way, positioning of the transport car 1 is effected.

When the transport car 1 is to be started from the stop position, the energization of the coils of the electromagnets 37 and 38 is stopped from the control circuit (not shown) to cancel the magnetic coupling between the electromagnets 37 and 38 and the magnetic members 35 and 36, and the transport car 1 is given horizontal propelling force from the linear motor (not shown), thereby enabling the transport car 1 to start from the stop position.

Figure 12:
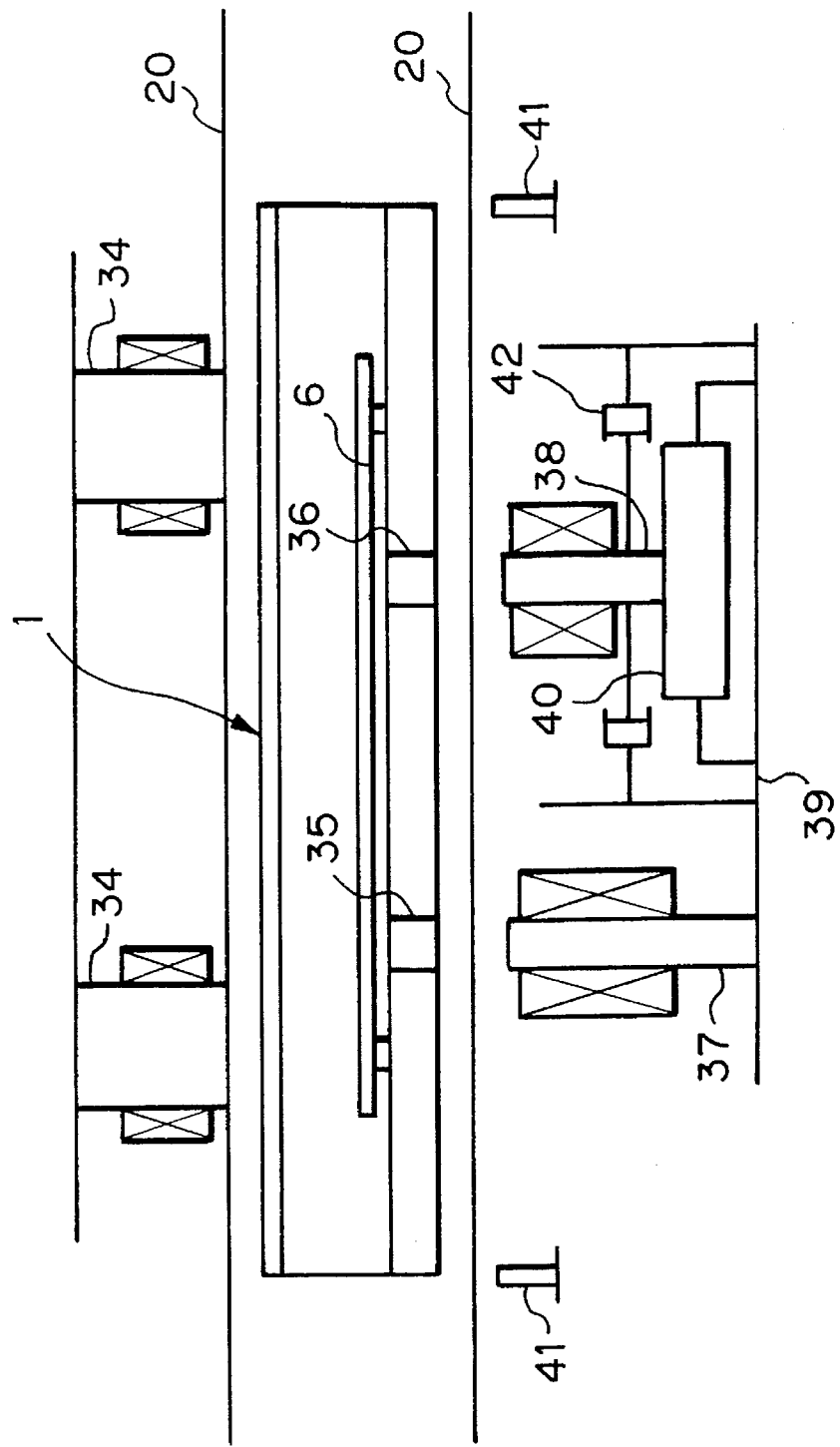
FIG. 12 is a schematic view illustrating a positioning system according to a fifth embodiment of the present invention.
Figure 13:
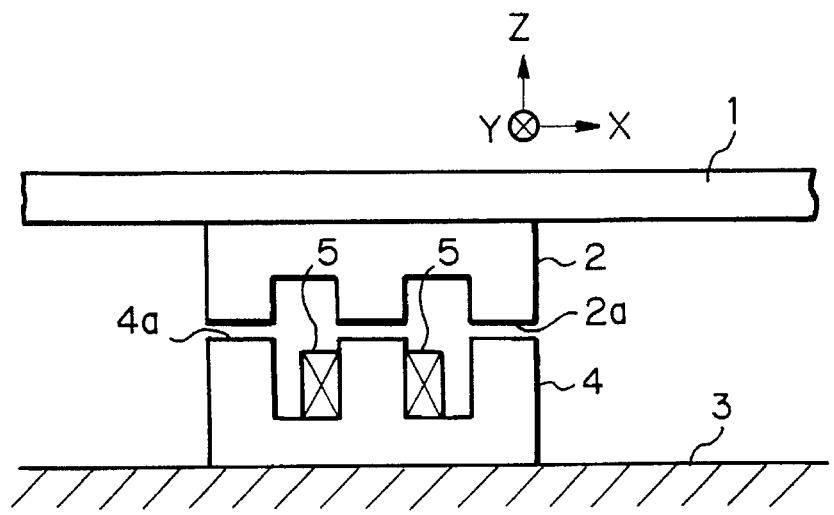
FIG. 13 is a sectional view of a conventional positioning system.
Figure 14:
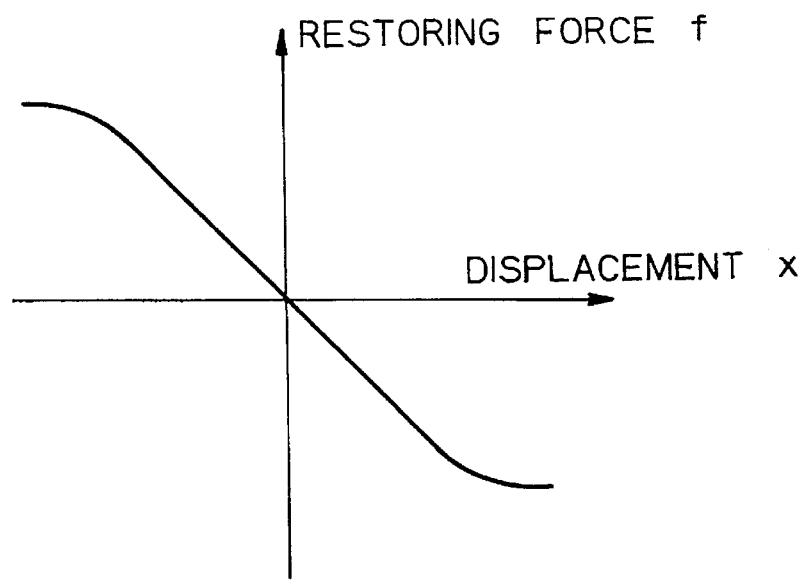
FIG. 14 is a graph illustrating the relationship between displacement X and restoring force f in the conventional positioning system.

FIG. 12 shows a positioning system according to a fifth embodiment of the present invention. In this embodiment, the guide mechanism 40 is additionally provided with a damper 42. The arrangement of the rest of the fifth embodiment is the same as that of the fourth embodiment. Therefore, the same elements are denoted by the same reference numerals, and repeated description thereof is omitted. The operation of the positioning system according to the fifth embodiment is similar to that of the positioning system according to the fourth embodiment. In this embodiment, however, a damping force produced by the damper 42 acts in addition to the frictional force produced by the guide mechanism 40. Accordingly, it is possible to quickly reduce the vibration of the electromagnet 38, which serves as a damping magnetic pole. Consequently, the vibration of the transport car 1 can be damped even more promptly.

Although in the foregoing fourth and fifth embodiments each pair of members which are coupled together by magnetic attraction force are an electromagnet and a magnetic member, respectively, it is also possible to use permanent magnets. Further, the magnetic members which are secured to the bottom surface of the transport car may be permanent magnets or electromagnets, provided that such members can be coupled to the stop position-side members by respective magnetic circuits and thus a magnetic attraction force is produced.

Further, although in the foregoing fourth and fifth embodiments a transport car is driven to travel inside a can-shaped vacuum tunnel partition by a magnetic levitation transport system, it is a matter of course that the positioning system of the present invention may also be applied to an ordinary contact type transport system having wheels.

In the fourth and fifth embodiments, the transport car inside the partition may be promptly stopped at a predetermined stop position in a non-contact manner by damping the vibration of a member that is disposed outside the partition. Accordingly, it is unnecessary to control the transport car stopping operation by detecting an amount of displacement of the transport car, for example. Therefore, the transport car need not be provided with a sensor target for positioning. Thus, the structure of the transport car can be simplified. Since the transport car stopping operation is effected by using magnetic coupling between members which are respectively disposed on the transport car and at the stop position, the material of the tunnel partition may be a good electrical conductor, provided that it is a non-magnetic material. Thus, it becomes possible to stop the transport car stably in a short time from the atmospheric air side through the tunnel partition. Accordingly, it becomes easy to produce a partition for forming a space of high cleanliness, e.g., a vacuum.

What is claimed is:

1. A positioning system for stopping a transport car travelling along a transport path at a predetermined stop position along said transport path, said positioning system comprising:

a first member mounted at said stop position;

a second member mounted on said transport car said first and second members being operable to be coupled together by a magnetic attraction force causing said transport car to stop at said stop position and at least one of said first and second members being mounted on the respective said stop position or said transport car by a damper operable to damp vibration of said transport car in a direction of movement thereof during stopping thereof at said stop position.

2. A positioning system according to claim 1, wherein said damper is operable to damp vibration of said transport car in all directions in a horizontal plane.

3. A positioning system according to claim 1, wherein said first member disposed at said stop position is a magnet, said damper is a passive damper having spring properties and damping properties, and said magnet is attached to a securing surface at said stop position through said passive damper.

4. A positioning system according to claim 3, wherein said passive damper comprises a viscous fluid and a plate spring hermetically sealed in a container together with said magnet.

5. A positioning system according to claim 3, wherein said passive damper comprises a viscous rubber accommodated in a container together with said magnet.

6. A positioning system according to claim 3, wherein said securing surface is provided on a positioning table which is mounted on a linear guide movable in a horizontal direction.

7. A positioning system according to claim 6, wherein said positioning table is provided on an actuator for vertically moving said positioning table.

8. A positioning system according to claim 1, wherein said first member disposed at said stop position is a magnet, said magnet is fixed to a vibrator having a substantial mass, said vibrator is attached to a guide mechanism which is restrained from moving in a vertical direction but is movable in a horizontal direction, said damper is an active damper having spring properties and damping properties, and said vibrator is attached to a securing surface at said stop position through said active damper.

9. A positioning system according to claim 8, wherein said securing surface is provided on a positioning table which is mounted on a linear guide movable in a horizontal direction.

10. A positioning system according to claim 9, wherein said positioning table is provided on an actuator for vertically moving said positioning table.

11. A positioning system according to claim 8, wherein said active damper includes means for detecting a speed and/or displacement of travel of said vibrator, a magnetic bearing for magnetically transmitting restoring force and damping force to said vibrator, and a controller for controlling said restoring force and damping force of said magnetic bearing based on a signal from said detecting means so that said transport car is stably stopped at said predetermined position.

12. A positioning system according to claim 1, wherein one of said first and second members comprises an electromagnet, and the other of said first and second members comprises a magnetic member.

13. A positioning system according to claim 1, wherein one of said first and second members comprises a permanent magnet, and the other of said first and second members comprises a magnetic member.

14. A positioning system according to claim 1, wherein said second member disposed on said transport car is provided within a can-shaped partition and said first member disposed at said stop position is positioned outside said can-shaped partition.

15. A positioning system according to claim 14, wherein said system is a magnetic levitation transport system having levitation magnetic poles for levitatively suspending said transport car, and a linear motor for imparting propelling force to said transport car, said levitation magnetic poles and linear motor being provided outside said can-shaped partition, so that said transport car levitatively travels inside said can-shaped partition.

16. A positioning system for stopping a transport car travelling along a transport path at a predetermined stop position along said transport path, said positioning system comprising:

two pairs of members, each said pair of members including a first member mounted at said stop position and a second member mounted on said transport car;

said first and second members of each of said pair of members being operable to be coupled together by a magnetic attraction force causing said transport car to stop at said stop position; and one of said first and second members of one of said pairs of members being attached to a guide mechanism operable to restrict movement of said one member in a direction of movement of said transport car resulting from said magnetic attraction force between said members.

17. A positioning system as claimed in claim 16, wherein said guide mechanism comprises a mechanical device operable to generate frictional force in opposition to said movement of said one member.

18. A positioning system according to claim 17, wherein said guide mechanism further includes a damper for generating a damping force in addition to said frictional force for further restricting movement of said one member attached to said guide mechanism.

19. A positioning system according to claim 16, wherein said one member comprises said first member of said one pair of members.

20. A positioning system according to claim 16, wherein a first said pair of members comprises magnet poles for magnetically holding said transport car and said stop position together, and a second said pair of members comprises magnet poles for damping movement of said transport car relative to said stop position.

21. A positioning system according to claim 16, further comprising a sensor for detecting an approach of said transport car to said predetermined stop position, said magnetic attraction force being caused to act between said pairs of members in response to a detected signal from said sensor.

22. A positioning system according to claim 16, wherein application of said magnetic attraction force between said pairs of members is canceled when said transport car stopped at said stop position is to be restarted.

23. A positioning system according to claim 16, wherein one of said first and second members of each said pair of members comprises an electromagnetic, and the other of said first and second members of each said pair of members comprises a magnetic member or a permanent magnet.

24. A positioning system according to claim 16, wherein one of said first and second members of each said pair of members comprises a permanent magnet, and the other of said first and second members of each said pair of members comprises a magnetic member or a permanent magnet.

* * * * *